(12) United States Patent
Thomas

(10) Patent No.: US 8,166,650 B2
(45) Date of Patent: May 1, 2012

(54) METHOD OF MANUFACTURING A PRINTED CIRCUIT BOARD

(75) Inventor: Wayne Bernard Thomas, Saginaw, MI (US)

(73) Assignee: Steering Solutions IP Holding Company, Saginaw, MI (US)

(*) Notice: Subject to any disclaimer, the term of this patent is extended or adjusted under 35 U.S.C. 154(b) by 910 days.

(21) Appl. No.: 12/129,938

(22) Filed: May 30, 2008

(65) Prior Publication Data

US 2009/0294165 A1 Dec. 3, 2009

(51) Int. Cl.
*H01K 3/10* (2006.01)

(52) U.S. Cl. ........ 29/852; 29/840; 228/180.22; 438/629

(58) Field of Classification Search .......... 29/832, 29/840, 852, 848; 228/180.22; 438/629
See application file for complete search history.

(56) References Cited

U.S. PATENT DOCUMENTS

| | | | |
|---|---|---|---|
| 4,396,936 A * | 8/1983 | McIver et al. .......... | 174/252 |
| 5,214,000 A | 5/1993 | Chazan et al. | |
| 5,298,791 A * | 3/1994 | Liberty et al. .......... | 257/707 |
| 5,511,306 A | 4/1996 | Denton et al. | |
| 5,561,322 A * | 10/1996 | Wilson .......... | 257/703 |
| 5,590,462 A * | 1/1997 | Hundt et al. .......... | 29/840 |
| 5,699,613 A | 12/1997 | Chong et al. | |
| 5,710,459 A | 1/1998 | Teng et al. | |
| 5,747,098 A | 5/1998 | Larson | |
| 5,923,084 A * | 7/1999 | Inoue et al. .......... | 257/712 |
| 6,015,520 A | 1/2000 | Appelt et al. | |
| 6,044,550 A | 4/2000 | Larson | |
| 6,190,941 B1 | 2/2001 | Heinz et al. | |
| 6,282,782 B1 | 9/2001 | Biunno et al. | |
| 6,350,952 B1 * | 2/2002 | Gaku et al. .......... | 174/522 |
| 6,381,838 B1 * | 5/2002 | Ahn et al. .......... | 29/848 |
| 6,472,741 B1 * | 10/2002 | Chen et al. .......... | 257/712 |
| 6,555,761 B2 | 4/2003 | Amir | |
| 6,852,625 B2 | 2/2005 | Shin et al. | |
| 7,147,141 B2 * | 12/2006 | Sato et al. .......... | 228/180.22 |
| 7,494,920 B2 * | 2/2009 | McCarthy et al. .......... | 438/629 |
| 2004/0048414 A1 | 3/2004 | Heinz et al. | |
| 2004/0089700 A1 * | 5/2004 | Sato et al. .......... | 228/180.22 |
| 2007/0090529 A1 * | 4/2007 | McCarthy et al. .......... | 257/738 |

FOREIGN PATENT DOCUMENTS

EP 1659839 A2 5/2006
WO 0114612 A1 3/2001

OTHER PUBLICATIONS

European Search Report and Office Action dated Oct. 22, 2009 for European Application No. 09161282-0.

* cited by examiner

*Primary Examiner* — Carl Arbes
(74) *Attorney, Agent, or Firm* — Cantor Colburn LLP

(57) ABSTRACT

A method of manufacturing a printed circuit board (PCB) includes of disposing thermal transfer vias and electrical vias through the PCB. The method further includes filling holes of the vias with a solder mask. The thermal transfer vias are filled to about 70% of capacity while the electrical vias are completely filled. Once filled, surfaces of the PCB are coated with an organic solderability preservative.

11 Claims, 5 Drawing Sheets

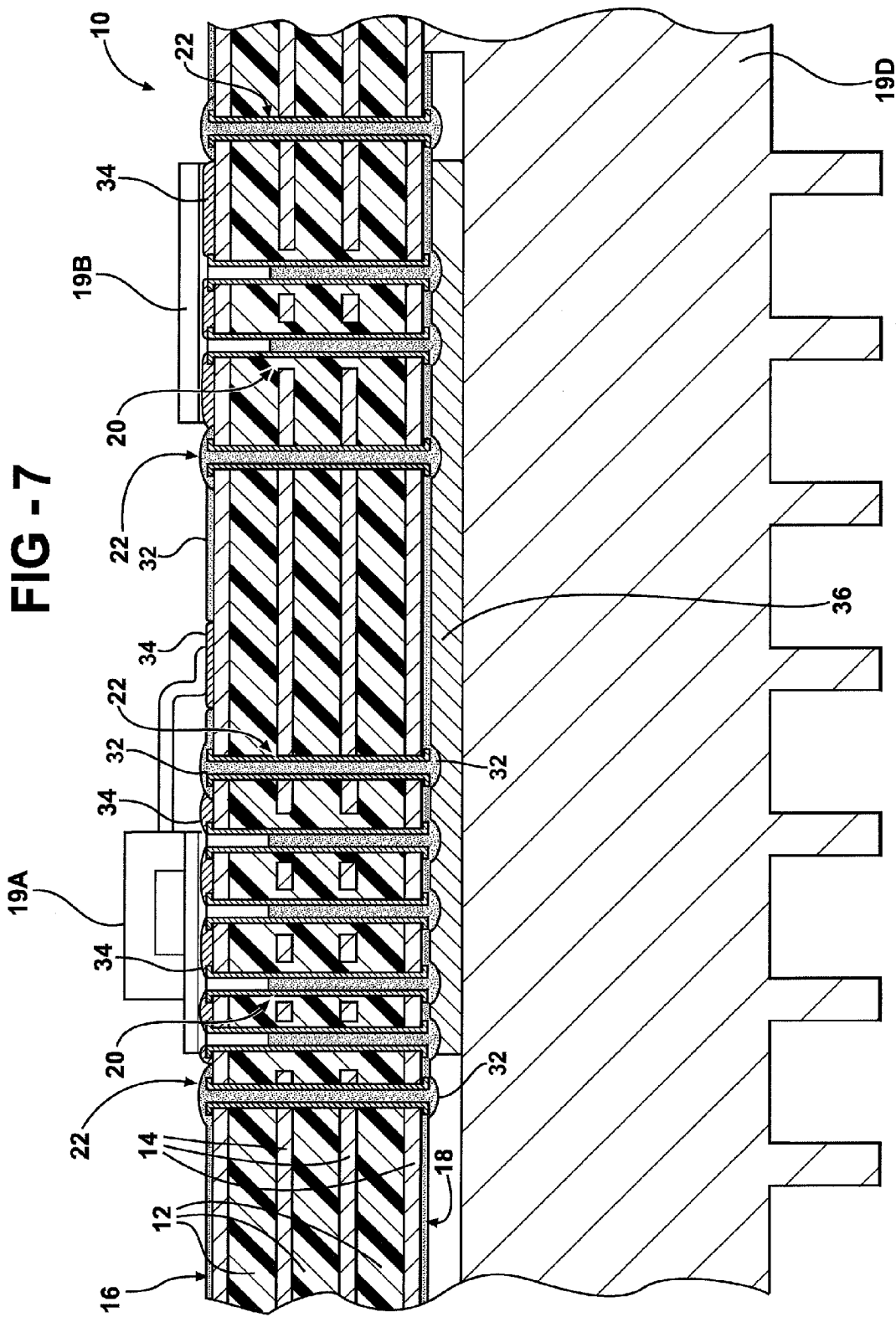

METHOD OF MANUFACTURING A PRINTED CIRCUIT BOARD

BACKGROUND OF THE INVENTION

1. Field of the Invention

The subject invention relates to a method of manufacturing a printed circuit board (PCB). Specifically, the subject invention relates to manufacturing a PCB having vias disposed through solder pads.

2. Description of the Related Art

Printed circuit boards (PCBs) are commonly used to support and electrically connect various components of an electrical or electronic circuit. Over the last several decades, these PCBs have become increasingly complex to match the complexity of the circuits they facilitate as well as aggressive size and packaging requirements.

A typical modern PCB now utilizes a plurality of conductive layers separated by non-conductive layers. Interconnection between the conductive layers is often provided utilizing a plated-through hole, commonly known as a via. These vias provide electrical and thermal transfer from one side of the PCB to another. A recent trend in the manufacture of PCBs is the disposition of the vias at the solder pads formed by the conductive layers. This practice is commonly referred to as "via in pad" design.

Via in pad designs are often wrought with difficulties. For instance, un-plugged via holes, as are typically required in hot air soldered level (HASL) finishes, tend to act as a capillary and wick solder away from the component that it is meant to secure. Another difficulty is the contamination of un-plugged via holes with conformal coatings used to protect the surfaces of the PCB. This contamination degrades heat transfer and touch-up operations are often required to remove the conformal coating from the vias.

HASL finishes themselves often provide additional difficulties in PCB circuit operation. For instance, the HASL finish on both sides of the PCB provides a thermal transfer surface that is also electrically conductive. This leads to less efficient thermal transfer. Also, the HASL finish often presents an uneven surface which contributes to soldering defects, particularly with components having a large number of pins, such as a digital signal processor.

Therefore, there is an opportunity to provide a PCB and method of manufacture that addresses these and other concerns.

SUMMARY OF THE INVENTION AND ADVANTAGES

The subject invention provides a method of manufacturing a printed circuit board (PCB). The PCB has at least one conductive layer and at least one non-conductive layer. The layers of the PCB form a first surface and a second surface. The method includes the step of disposing at least one via through the PCB to connect the surfaces. The at least one via includes a metallic portion having a pair of ends. The metallic portion defines a hole. The method further includes the step of filling the hole of the at least one via with a solder mask. The hole is filled to a certain height between the ends. The method also includes the step of coating at least a portion of one of the surfaces of the PCB with an organic solderability preservative in response to the filling of the hole of the at least one via.

The PCB produced by implementation of the method of the subject invention is durable, easily manufactured, and does not require time-consuming rework. Furthermore, the PCB provides substantially even surfaces, which reduces soldering defects of electronic components having numerous pins. Moreover, the PCB provides excellent heat transfer from one surface to another which reduces overheating of electrical and electronic components.

BRIEF DESCRIPTION OF THE DRAWINGS

Other advantages of the present invention will be readily appreciated, as the same becomes better understood by reference to the following detailed description when considered in connection with the accompanying drawings wherein:

FIG. 7 is a cross-sectional side view of the PCB showing the electrical components supported on the first surface and a heat sink connected to the second surface.

DETAILED DESCRIPTION OF THE INVENTION

Figure 1:
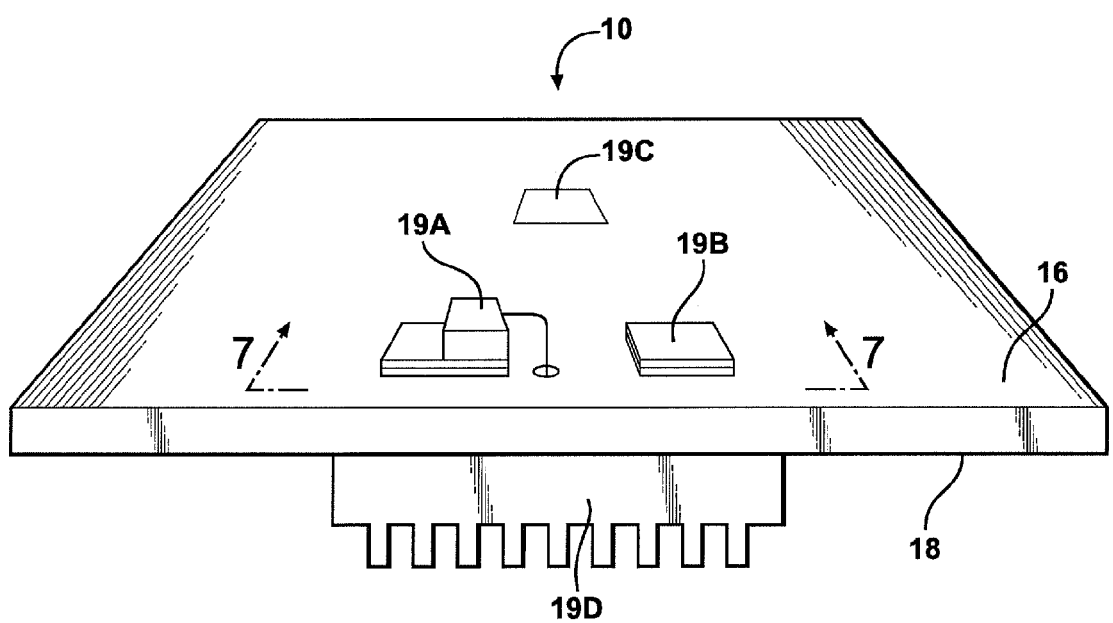
FIG. 1 is a perspective view of an illustrated embodiment of a printed circuit board (PCB) supporting various electrical and electronic components.

The subject invention provides a method of manufacturing a printed circuit board (PCB) 10. The PCB 10 is preferably a laminate of at least one non-conductive layer 12 and at least one conductive layer 14. The layers 12, 14 of the PCB 10 form a first surface 16 and a second surface 18. Various electrical and electronic components 19 are mountable and/or solderable to these surfaces 16, 18 as is well known to those skilled in the art.

The PCB 10 of the illustrated embodiment supports and electrically connects the various components 19 of an electronic power steering (EPS) controller (not numbered) for a vehicle (not shown). Of course, the teachings described herein are not limited to the particular application shown in the illustrated embodiment. That is, the PCB 10 may be utilized to electrically connect any number of components for any number of applications. The components 19 of the EPS controller, as shown in FIG. 1, include, but are not limited to, a MOSFET 19A, a current sense resistor 19B, and a digital signal processor 19C. The MOSFET 19A and the current sense resistor 19B provide significant heat which must be dissipated in order to prevent premature failure of these components 19A, 19B and the controller as a whole. Accordingly, the EPS controller includes a heat sink 19D for dissipating this heat.

As shown in the Figures, the PCB 10 of the illustrated embodiment includes three non-conductive layers 12 and four conductive layers 14. Each non-conductive layer 12 is sandwiched between a pair of conductive layers 14. More specifically, two of the conductive layers 14 are exterior conductive layers 14 that form the surfaces and the other two conductive layers 14 are interior conductive layers 14 disposed between the interior conductive layers 14. Of course, in other embodiments, the PCB 10 may be formed with other quantities and configurations of non-conductive and conductive layers 12, 14 as are well known to those skilled in the art.

Each non-conductive layer 12 is preferably formed of a plastic, however, other suitable materials are known to those skilled in the art. Each conductive layer 14 is preferably formed of a conductive metal such as, but not limited to, copper, silver, or gold. Those skilled in the art appreciate other suitable materials to form the non-conductive and conductive layers 12, 14. Each conductive layer 14 is preferably patterned to form electrical interconnections to the components attached to the conductive layer 14, as is well known to those skilled in the art. Techniques to form the electrical interconnect pattern are also well known to those skilled in the art. Furthermore, the pattern of each conductive layer 14 preferably provides a plurality of solder pads (not separately shown or separately numbered). The solder pads provide a region of the conductive layer 14 to solder the components to the PCB 10, as is well known to those skilled in the art.

The method of the subject invention includes the step of disposing at least one via 20, 22 through the PCB 10 to connect the surfaces 16, 18. Preferably, a plurality of vias 20, 22 are disposed through the PCB 10 as described in further detail below. In the illustrated embodiments, at least some of the plurality of vias 20, 22 are disposed through the solder pads. Thus, the PCB 10 and method described herein provides a "via in pad" design as is understood by those skilled in the art.

Each via 20, 22 includes a metallic portion 24 formed of an electrically conductive material, such as a metal. Preferably, the metallic portion 24 is preferably has a cylindrical shape, however, other shapes may also be acceptable. The metallic portion 24 of each via 20, 22 has a first end 26 and a second end 28. The first end 26 generally abuts the first surface 16 of the PCB 10 while the second end 28 generally abuts the second surface 18 of the PCB 10. The metallic portion 24 defines a height between the ends 26, 28. Furthermore, the metallic portion 24 forms a hole 30 that extends between the ends 26, 28. A width of each hole 30 is preferably defined as the maximum distance, e.g., the diameter, of the hole defined by the metallic portion 24. In the illustrated embodiment, the diameter of the hole 30 measures about 0.3 mm and the height of the hole 30 measures about 1.6 mm. Accordingly, the height-to-width ratio of the hole 30 is about 5.3:1. However, other suitable dimensions and ratios of the hole 30 are evident to those skilled in the art.

Each via 20, 22 of the subject invention is categorized as either a thermal transfer via 20 or an electrical via 22. The thermal transfer vias 20 function primarily to conduct heat from one surface 16, 18 of the PCB 10 to the other surface 18, 16. The electrical vias 22 function primarily to conduct electrical current from one of the conductive layers 14 to another of the conductive layers 14. Although the primary purpose of the thermal transfer via 20 is to conduct heat and the primary purpose of the electrical vias 22 is to conduct electrical current, the thermal transfer vias 20 may also conduct electrical current and the electrical vias 22 may also conduct heat.

FIG. 7 shows one embodiment of the invention where the thermal transfer vias 20 conduct heat from electrical devices 19A, 19B mounted on the first surface 16 and towards a heat sink 19D connected to the second surface 18. In the illustrated embodiment, the thermal transfer vias 20 are electrically insulated from at least one of the conductive layers 14. That is, the thermal transfer vias 20 are not in direct contact with at least one of the conductive layers 14. Specifically, in the illustrated embodiment, the thermal transfer vias 20 are electrically insulated from the interior conductive layers 14.

Figure 2:
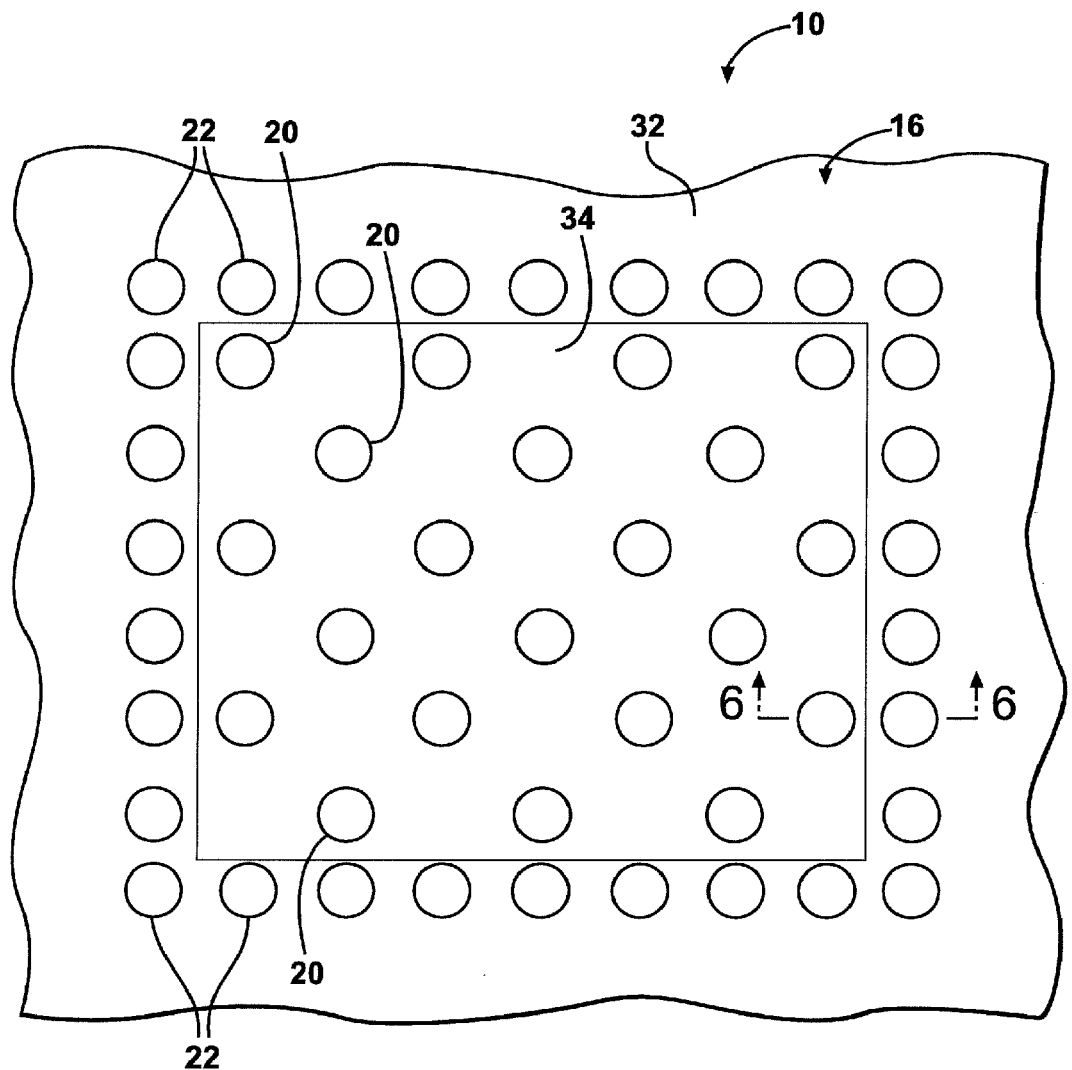
FIG. 2 is a top view of the PCB showing a plurality of thermal transfer vias and electrical vias.
Figure 3:
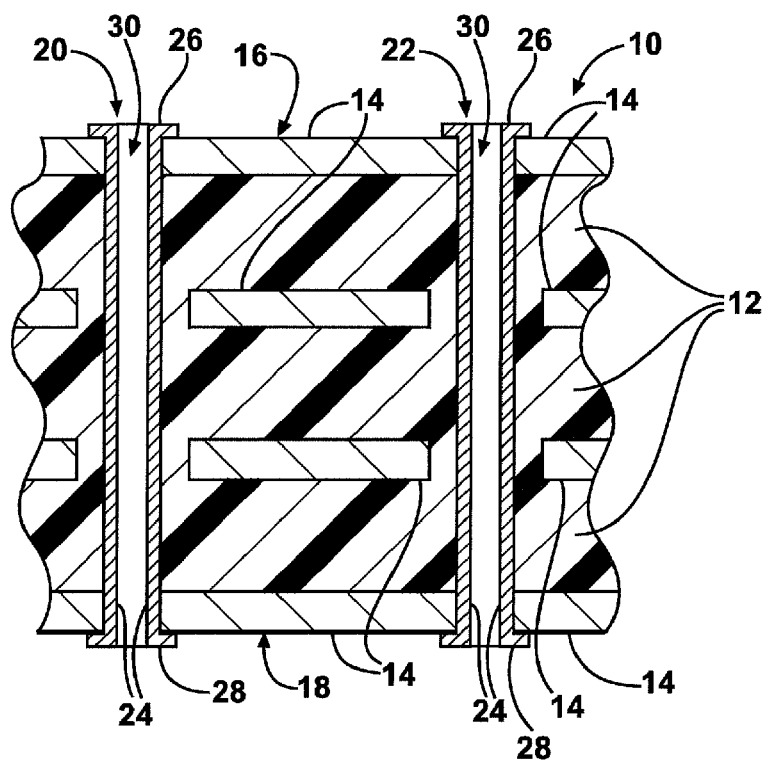
FIG. 3 is a cross-sectional side view of a portion of the PCB showing a thermal transfer via and an electrical via providing continuity between first and second surfaces.

The method continues with the step of filling the hole 30 of each via 20, 22 with a solder mask 32 to a certain level between the ends 26, 28, as shown in FIG. 2. It is important to note that the term "filling" as used herein does not necessarily require a complete and total obstruction of the hole 30 with the solder mask 32. Rather, the term "filling" refers to the act of introducing a certain amount of solder mask 32 into the hole 30.

The solder mask 32 is preferably a lacquer-based material, as is well known to those skilled in the art. One suitable material for constituting the solder mask 32 is Probimer® 77 manufactured by Huntsman Corporation of Salt Lake City, Utah. More particularly, the solder mask 32 may be a mix of Probimer® 77/7179 Resin and Probimer® 77/7180 Hardener. Those skilled in the art realize other suitable materials for constituiting the solder mask 32.

Each electrical via 22 is filled to level of about 100% of the height of the hole 30. Said another way, the hole 30 of each electrical via 22 is completely filled with the solder mask 32. Each thermal transfer via 20 is filled to a level between 60 and 100% of the height of the hole 30. That is, the thermal transfer vias 20 are partially filled with the solder mask 32. Preferably, each thermal transfer via 20 is filled to a level of about 70% of the height of the hole 30. After filling the hole 30 of the thermal transfer via 20 to the 70% level, the diameter of the hole 30 still measures about 0.3 mm. However, the adjusted height of the hole 30, from the solder mask 32 to the first end 26 measures about 0.48 mm. Accordingly, the width-to-height ratio of the 70% filled hole 30 is about 1.6:1.

When filling the holes 30 of the vias 20, 22 with the solder mask 32, overfilling of the via 20, 22 may occur. That is, the solder mask 32 may extend beyond one or both of the ends 26, 28. Ideally, the solder mask 32 does not extend more than 50 microns past the overfilled end 26, 28 of the via 20, 22. Of course, with the electrical via 22, the overfill typically occurs on both ends 26, 28 while with the thermal transfer via 20, the overfill typically occurs only on the second end 28.

Figure 4:
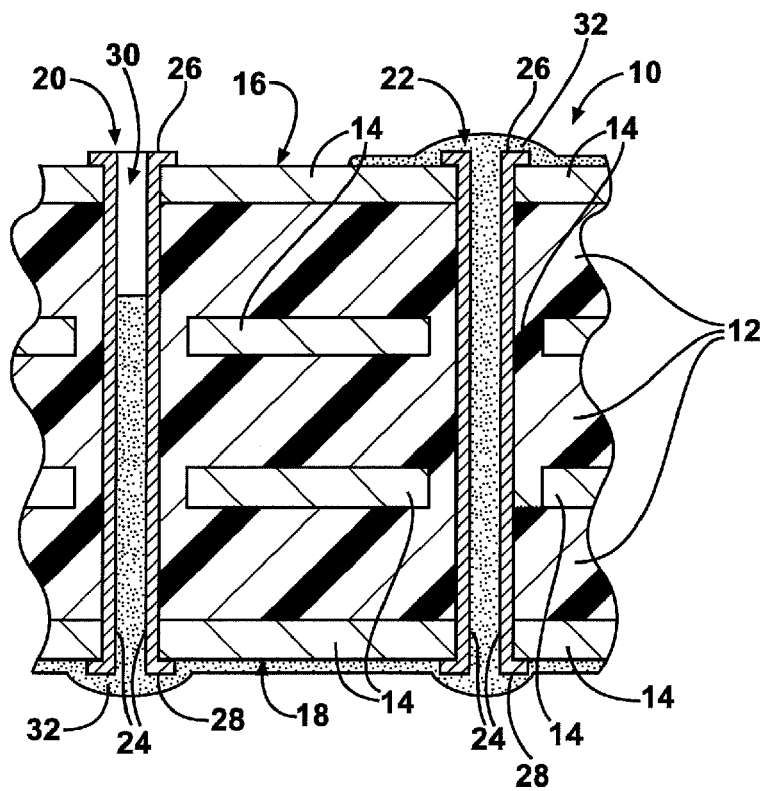
FIG. 4 is a cross-sectional side view of the portion of the PCB showing a hole of the electrical via completely filled with a solder mask and a hole of the thermal transfer via partially filled with the solder mask.

The solder mask 32 may also be applied to portions of one or both surfaces 16, 18 of the PCB 10 to provide electrical insulation to the portions of the surfaces 16, 18. In the illustrated embodiment, as shown in FIG. 4, the solder mask 32 is applied also applied to portions of the second surface 18 of the PCB 10 surrounding the vias 20, 22 and a portion of the first surface 18 surrounding the electrical via 22. Generally, in the illustrated embodiment, the solder mask 32 is not applied to portions of the first surface 16 that must remain conductively exposed for electrical connection of one of the components 19.

Figure 5:
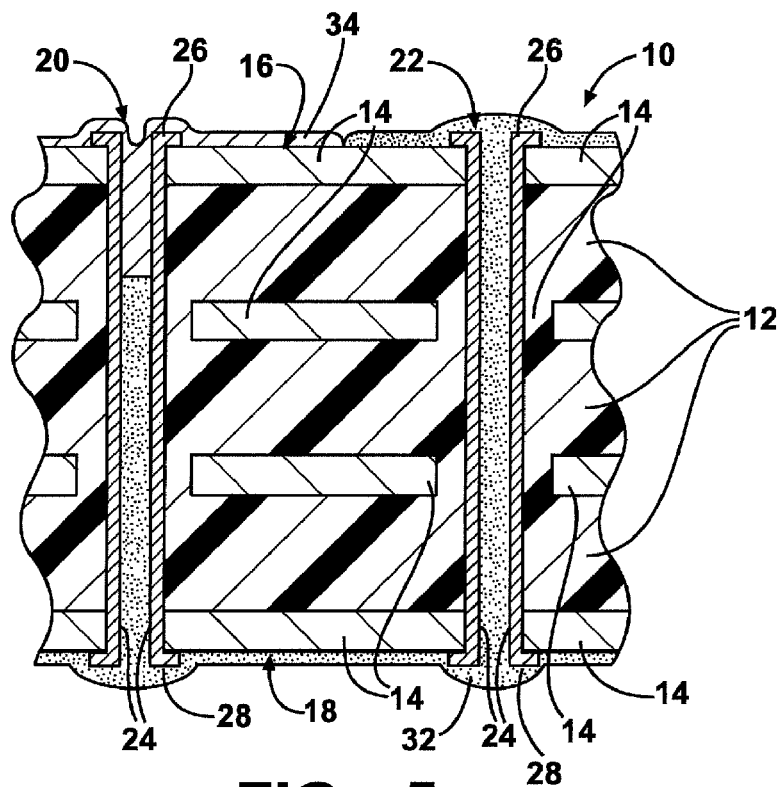
FIG. 5 is a cross-sectional side view of the portion of the PCB showing an organic solderability preservative (OSP) applied to at least one of the surfaces.

As shown in FIG. 5, the method also includes the step of coating at least a portion of one of the surfaces 16, 18 of the PCB 10 with an organic solderability preservative (OSP) 34. The OSP 34 is applied to those portions of the surfaces 16, 18 that must remain conductively exposed for electrical connection of one of the components 19, as mentioned above. This step is preferably performed in response to the filling of the holes 30 of the vias 20, 22 with the solder mask 32. In other words, the OSP 34 is applied after the application of the solder mask 32. Furthermore, the layer of OSP 34 ideally measures about 0.3 to 0.6 microns in thickness. The use of the OSP 34 in the subject invention provides very low soldering defects in comparison to non-OSP techniques.

By filling each via 20, 22 with the solder mask 32 prior to the application of the OSP 34, the method of the subject invention prevents the OSP 34 from being trapped in the holes 30 of the electrical vias 22. Therefore, the electrical vias 22 are not exposed to the chemicals of the OSP 34. Furthermore, by providing separate electrical and thermal transfer vias 22, 20, in combination with the filling of the vias 22, with the solder mask 32 as described above, the PCB 10 allows improved heat transfer over prior art techniques.

As shown in FIG. 5, the method further includes the step of removing the OSP 34 from the hole 30 of the thermal transfer via 22 in response to the application of the OSP 34. This cleanout procedure mitigates the possibility of the thermal transfer via 22 from cracking. The cleanout procedure may be performed with multiple water showers, a "squeeze" with an air knife, and a hot air dry. However, other techniques for performing the cleanout procedure are known to those skilled in the art.

Figure 6:
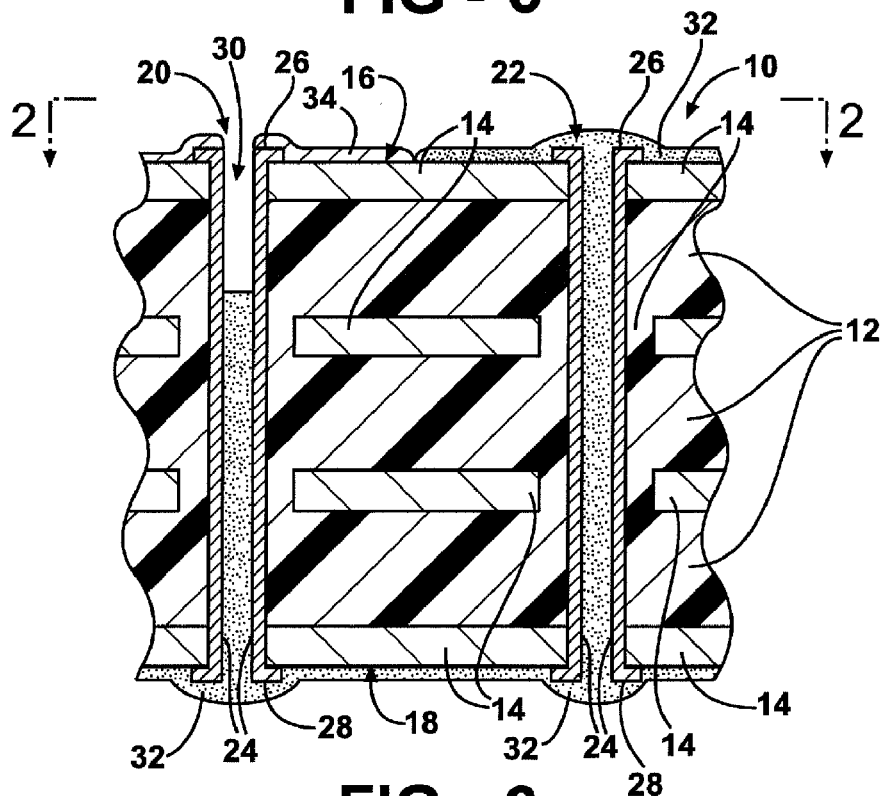
FIG. 6 is a cross-sectional side view of the portion of the PCB showing excess OSP removed from the hole of the thermal transfer via.

The method may also include the step of placing a thermal transfer material 36 in thermal communication with at least one of the thermal transfer vias 20. Preferably, in the illustrated embodiment as shown in FIG. 6, the thermal transfer material 36 is in contact with the solder mask 32 disposed over the second surface 18. Thus, the thermal transfer material 36 transfers heat from the second surface 18 and the thermal transfer vias 20.

As also shown in FIG. 6, the heat sink 19D is in thermal communication with the at least one thermal transfer via 20 for dissipating heat transferred through the thermal transfer via 20. In the illustrated embodiment, the heat sink 19D is in contact with the thermal transfer material 36. However, the heat sink 19D may alternative be in direct contact with the at least one thermal transfer via 20.

The present invention has been described herein in an illustrative manner, and it is to be understood that the terminology which has been used is intended to be in the nature of words of description rather than of limitation. Obviously, many modifications and variations of the invention are possible in light of the above teachings. The invention may be practiced otherwise than as specifically described within the scope of the appended claims.

What is claimed is:

1. A method of manufacturing a printed circuit board (PCB) having at least one conductive layer and at least one non-conductive layer and forming a first surface and a second surface, said method comprising:
   disposing at least one via through the PCB to connect the surfaces wherein the at least one via includes a metallic portion having a pair of ends and defining a hole;
   filling the hole of the at least one via with a solder mask to a certain level between the ends; and
   coating at least a portion of one of the surfaces of the PCB with an organic solderability preservative (OSP).

2. A method as set forth in claim 1 wherein the at least one via is further defined as a plurality of vias including at least one thermal transfer via for conduction of heat between the surfaces and at least one electrical via for conduction of electrical current between the surfaces.

3. A method as set forth in claim 2 wherein said step of filling the hole of the at least one via with a solder mask is further defined as filling the hole of the at least one electrical via with a solder mask to a level of about 100 percent of the height of the electrical via.

4. A method as set forth in claim 2 wherein said step of filling the hole of the at least one via with a solder mask is further defined as filling the hole of the at least one thermal transfer via with a solder mask to a level between 45 and 95 percent of the height of the thermal transfer via.

5. A method as set forth in claim 4 wherein the level is about 70 percent of the height of the thermal transfer via.

6. A method as set forth in claim 2 wherein said step of filling the hole of the at least one via with a solder mask is further defined as filling the hole of the at least one electrical via with a solder mask to a level of about 100 percent of the height of the electrical via and filling the hole of the at least one thermal transfer via with a solder mask to a level between 45 and 95 percent of the height of the thermal transfer via.

7. A method as set forth in claim 2 further comprising the step of placing a thermal transfer material in thermal communication with the at least one thermal transfer via for transferring heat from the thermal transfer via.

8. A method as set forth in claim 2 further comprising the step of placing a heat sink in thermal communication with the at least one thermal transfer via for transferring heat from the thermal transfer via.

9. A method as set forth in claim 1 wherein said step of coating at least a portion of one the surfaces of the PCB with the OSP is performed in response to said the filling of the hole of the at least one via.

10. A method of manufacturing a printed circuit board (PCB) having a pair of conductive layers and at least one non-conductive layer sandwiched between said conductive layers and wherein said conductive layers define a first surface and a second surface, said method comprising:
    disposing at least one electrical via defining a pair of ends and a hole extending between said ends through the layers to electrically connect the conductive layers;
    completely filling the hole of the electrical via with a solder mask;
    disposing at least one thermal transfer via defining a pair of ends and a hole extending between said ends through the layers to connect the surfaces; and
    partially filling the hole of the thermal transfer via with a solder mask.

11. A method as set forth in claim 10 further comprising the step of coating at least a portion of one of the surfaces of the PCB with an organic solderability preservative (OSP).

* * * * *